United States Patent [19]

Fisher

[11] Patent Number: 5,068,006

[45] Date of Patent: Nov. 26, 1991

[54] THERMAL INK JET PRINTHEAD WITH PRE-DICED NOZZLE FACE AND METHOD OF FABRICATION THEREFOR

[75] Inventor: Almon P. Fisher, Rochester, N.Y.

[73] Assignee: Xerox Corporation, Stamford, Conn.

[21] Appl. No.: 577,245

[22] Filed: Sep. 4, 1990

[51] Int. Cl.[5] ...................... H01L 21/306; B44C 1/22; B29C 37/00

[52] U.S. Cl. .................................... 156/633; 156/257; 156/645; 156/657; 156/662; 156/668; 346/140 R

[58] Field of Search ............... 156/250, 252, 264, 257, 156/268, 510, 526, 633, 644, 645, 657, 659.1, 662, 668; 346/1.1, 76 PH, 140 R

[56] References Cited

U.S. PATENT DOCUMENTS

| | | | |
|---|---|---|---|
| Re. 32,572 | 1/1988 | Hawkins et al. | 156/626 |
| 4,638,337 | 1/1987 | Torpey et al. | 346/140 |
| 4,774,530 | 9/1988 | Hawkins | 346/140 |
| 4,878,992 | 11/1989 | Campanelli | 156/633 |

*Primary Examiner*—William A. Powell
*Attorney, Agent, or Firm*—Robert A. Chittum

[57] ABSTRACT

A plurality of thermal ink jet printheads, each with nozzles in a pre-diced nozzle face, obtained from sectioning of an etched channel wafer aligned and mated with a heating element containing wafer that have a patterned thick film layer sandwiched therebetween. The printhead nozzles and pre-diced nozzle face are produced in the channel wafer prior to the alignment and mating of the wafers by the combination of dicing a notch in the channel wafer through one end of a plurality of sets of etched channel grooves, forming the nozzles and the nozzle face in the channel wafer and photodelineating the thick film layer on the heating element wafer, so that when the wfaers are mated, the delineated edge of the thick film layer becomes part of the nozzles without requiring the cutting of the thick film layer by a dicing blade. In one embodiment, the heating element wafer has a similar notch diced therein adjacent the delineated edge of the thick film layer prior to mating with the channel wafer. The two notches are confrontingly aligned and the mated wafers are selected into separate printheads by dicing through the aligned notches, so that the dicing blade is spaded from the printhead nozzle faces.

18 Claims, 7 Drawing Sheets

THERMAL INK JET PRINTHEAD WITH PRE-DICED NOZZLE FACE AND METHOD OF FABRICATION THEREFOR

BACKGROUND OF THE INVENTION

1. Field of the Invention

This invention relates to a thermal ink jet printhead and method of manufacture and, more particularly, to an improved thermal ink jet printhead, comprising mated channel and heating element substrates sandwiching a thick film layer, and method of fabrication thereof achieved by dicing the nozzle face in the channel substrate and photodelineating the thick film layer on the heating element substrate to form an edge parallel to the heating elements prior to mating of the substrates. After the substrates are mated, a printhead is formed with a stepped nozzle face that allows more effective cleaning and improved droplet directionality.

A concurrently filed application, U.S. Ser. No. 07/577,244, filed Sept. 4, 1990, by the same inventor and assignee entitled "Thermal Ink Jet Printhead with Stepped Nozzle Face and Method of Fabrication Therefor" discloses a related invention.

2. Description of the Prior Art

Thermal ink jet printing, though capable of continuous stream operation, is generally a type of drop-on-demand ink jet systems, wherein an ink jet printhead expels ink droplets on demand by the selective application of a current pulse to a thermal energy generator, usually a resistor, located in capillary-filled, parallel ink channels a predetermined distance upstream from the channel nozzles or orifices. The channel end opposite the nozzles are in communication with a small ink reservoir to which a larger external ink supply is connected.

U.S. Pat. No. Re. 32,572 to Hawkins et al discloses a thermal ink jet printhead and several fabricating processes therefor. Each printhead is composed of two parts aligned and bonded together. One part is a substantially flat substrate which contains on the surface thereof a linear array of heating elements and addressing electrodes, and the second part is a substrate having at least one recess anisotropically etched therein to serve as an ink supply manifold when the two parts are bonded together. A linear array of parallel grooves are also formed in the second part, so that one end of the grooves communicate with the manifold recess and the other ends are open for use as ink droplet expelling nozzles. Many printheads can be made simultaneously by producing a plurality of sets of heating element arrays with their addressing electrodes on a silicon wafer and by placing alignment marks thereon at predetermined locations. A corresponding plurality of sets of channel grooves and associated manifolds are produced in a second silicon wafer. In one embodiment, alignment openings are etched in the second silicon wafer at predetermined locations. The two wafers are aligned via the alignment openings and alignment marks, then bonded together and diced into many separate printheads.

U.S. Pat. No. 4,638,337 to Torpey et al discloses an improved thermal ink jet printhead similar to that of Hawkins et al, but has each of its heating elements located in a recess. The recess walls containing the heating elements prevent the lateral movement of the bubbles through the nozzle and therefore the sudden release of vaporized ink to the atmosphere, known as blow-out, which causes ingestion of air and interrupts the printhead operation whenever this event occurs. In this patent, a thick film organic structure such as Riston ® or Vacrel ® is interposed between the heater plate and the channel plate. The purpose of this layer is to have recesses formed therein directly above the heating elements to contain the bubble which is formed over the heating elements, thus enabling an increase in the droplet velocity without the occurrence of vapor blow-out and concomitant air ingestion.

U.S. Pat. No. 4,774,530 to Hawkins discloses an improvement over the above-mentioned patent to Torpey et al. Recesses are also patterned in the thick film layer to provide a flow path for the ink from the manifold to the channels by enabling the ink to flow around the closed ends of the channels, thereby eliminating the fabrication steps required to open the groove closed ends to the manifold recess, so that the printed fabrication process is simplified.

U.S. Pat. No. 4,878,992 to Campanelli discloses an ink jet printhead fabrication process wherein a plurality of printheads are produced from two mated substrates by two dicing operations. One dicing operation produces the nozzle face for each of a plurality of printheads and optionally produces the nozzles. This dicing blade, together with specific operating parameters, prevent the nozzles from chipping and the nozzle faces from scratches and abrasions. A second dicing operation with a standard dicing blade severs the mated substrates into separate printheads. The dicing operation which produces the nozzle face is preferably conducted in a two-step operation. A first cut makes the nozzle face, but does not sever the two mated substrates. A second dicing cut severs the two substrates, but does so in a manner that prevents contact by the dicing blade with the nozzle face.

In the above patents and in other prior art fabrication methods, the nozzle face of the printheads were made by either a separately fabricated nozzle plate which contains the nozzles and is bonded to the printheads, photolithographically produced from laminated layers, or dicing operation in which aligned and bonded channel plates and heating element plates having a patterned thick film layer sandwiched therebetween are concurrently cut. Unfortunately, in the latter method, the thick film layer cannot consistently be cut in a reliable way. Sometimes a burr is left which causes misdirection of an ejected droplet and, thus poor image quality. In addition, the dicing blade is considerably worn when it cuts non-silicon material, such as, when sectioning the heating element and channel wafers and sandwiched intermediate thick film layer as taught by U.S. Pat. No. 4,878,992.

The invention overcomes the disadvantages of the prior art fabrication methods, eliminating a host of defects which affect dicing yield, and reduces dicing blade wear by orders of magnitude.

SUMMARY OF THE INVENTION

It is an object of the present invention to increase the printhead fabrication yield in a cost effective manner.

It is another object of the invention to provide a printhead having a pre-diced nozzle face that can withstand aggressive contact cleaning techniques without contact with the nozzles.

It is still another object of the invention to provide a printhead having improved droplet directionality.

In the present invention, a plurality of thermal ink jet printheads having pre-diced nozzle faces are obtained from aligned, mated, and bonded upper and lower substrates. Prior to mating, an upper substrate surface is patterned and anisotropically etched to produce a plurality of sets of parallel channel grooves having closed ends and an associated manifold recess adjacent one end of each set of grooves. The manifold recess is etched through the upper substrate to provide an open bottom, followed by opening of the groove ends opposite the ones adjacent the manifold recesses by a dicing cut of predetermined depth forming a notch or trench with parallel sidewalls, one of which contains the groove open ends that will serve as part of the printhead nozzles. The trench wall with the groove open ends will therefore serve as a portion of the stepped nozzle face.

The lower substrate has a plurality of heating element arrays and addressing electrodes formed on one surface thereof and a thick film layer of insulative polymeric material, such as polyimide, deposited thereon over the heating elements and electrodes. The thick film layer is photodelineated to enable etch removal specific patterns of the thick film layer to expose the heating elements and, in one embodiment, to provide a trough for use as an ink flow path from the manifold recess to the associated channel grooves. Concurrently, a slot is produced in the thick film layer having at least one edge parallel to the heating element array and a predetermined distance therefrom to define the distance of the nozzles from the heating elements. When the substrates are mated and bonded together the edge of the slot in the thick film layer will serve as the bottom portion of the nozzles with the groove open ends serving as the remainder of the nozzles.

In this embodiment, the plurality of printheads are sectioned into individual printheads by a dicing operation, in which one dicing cut is made through both substrates parallel to but spaced from the groove open ends, so that a stepped nozzle is produced with the portion of the nozzle face containing the nozzles being recessed. Such a configuration enables dicing without having to cut through the thick film layer or the bonding material, thus increasing the dicing blade lifetime by more than an order of magnitude. Since the thick film layer tends to produce burrs when diced that affect droplet directionality, the removal of the need to dice the thick film layer increases the yield of suitable printheads to near 100%. Because the portion of the stepped nozzle face containing the nozzles are recessed, the remaining portion of the nozzle face can be aggressively contact cleaned by, for example, a blade cleaner.

Other embodiments of the printhead with a stepped nozzle face include reversing the nozzle face steps, so that the portion of the nozzle face containing the nozzles are slightly raised for gentler contact cleaning, while retaining all of the other advantages. In still another embodiment, a similar notch or trench is diced in the lower substrate adjacent the delineated slot edge of the thick film layer prior to mating with the upper substrate. When the upper and lower substrates are mated, the two trenches are confrontingly aligned and sectioned into separate printheads by colinear dicing through the aligned trenches, so that the nozzle faces are recessed. The trenches provide a means for aligning the substrates, if they are silicon, for the diced trenches are readily observable with an infrared aligner.

A more complete understanding of the present invention can be obtained by considering the following detailed description in conjunction with the accompanying drawings, wherein like parts have like index numerals.

DESCRIPTION OF THE PREFERRED EMBODIMENT

As disclosed in the prior art discussed above and shown in FIG. 1, thermal ink jet die or printheads 10 are generated in batches by aligning and adhesively bonding an anisotropically etched channel wafer 12 to the heater wafer 14 followed by a dicing sectioning step to separate the individual die. Although a single dicing cut could sever both the channel and heater wafers, U.S. Pat. No. 4,878,992 teaches the use of one dicing cut which severs the channel wafer, but only partially cuts through the heater wafer bonded thereto. A second, coarse, lower cost metal blade finishes the task because the adhesive used to hold the heater wafer in the dicing frame causes extra wear on a high-tolerance, resinoid dicing blade necessary to open the channel groove and concurrently form the nozzles and nozzle face.

Figure 1:
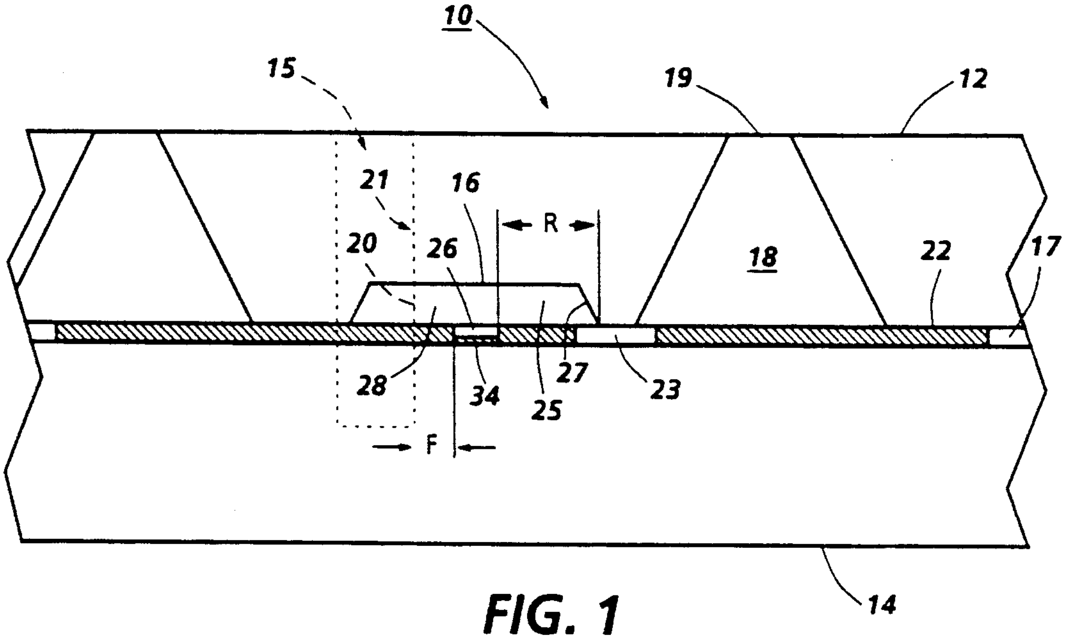
FIG. 1 (Prior Art)
FIG. 1 is a cross-sectional view of a portion of aligned and adhesively bonded channel wafer and heating element wafer prior to separation into a plurality of individual thermal ink jet printheads by dicing according to the prior art.

This first nozzle and nozzle face producing kerf 15 is shown in dashed line; the final sectioning cut through kerf 15 is not shown. U.S. Pat. No. 4,774,530 and prior art FIG. 1, showing processed, mated wafers in a cross sectional view, disclosed anisotropically etching a plurality of sets of elongated, parallel grooves 16 closed at both ends, and a through recess 18 with an open bottom 19 which subsequently serve as ink reservoir and ink inlet respectively. The heater wafer has a plurality of linear arrays of heating elements 34 and associated addressing electrodes (not shown) formed on one surface 17 thereof. A thick film insulative layer 22 of a photopatternable material, such as, for example, polyimide is deposited on the heater wafer surface 17 and over the eating elements and addressing electrodes. This thick film layer is patterned to expose the heating elements, thereby placing the heating elements in separate pits 26, to remove the thick film layer from the electrode terminals (not shown), and to remove the thick film layer at a location which will subsequently provide an ink flow passage 23 between the reservoir and the channels. The etched channel wafer and heater wafer containing the heating elements arrays, addressing electrodes, and patterned thick film layer are aligned and bonded together, so that the thick film layer is sandwiched there between and each channel groove 16 has a heating element 34 therein. These bonded wafers are separated into a plurality of individual die or printheads by a dicing operation that includes placing the bonded wafers in a dicing frame (not shown), which removably holds them, while a high tolerance dicing machine with a resinoid blade, as disclosed in U.S. Pat. No. 4,878,992, forms kerf 15 and a subsequent dicing cut (not shown) severs bonded wafers into printheads 10.

Figure 2:
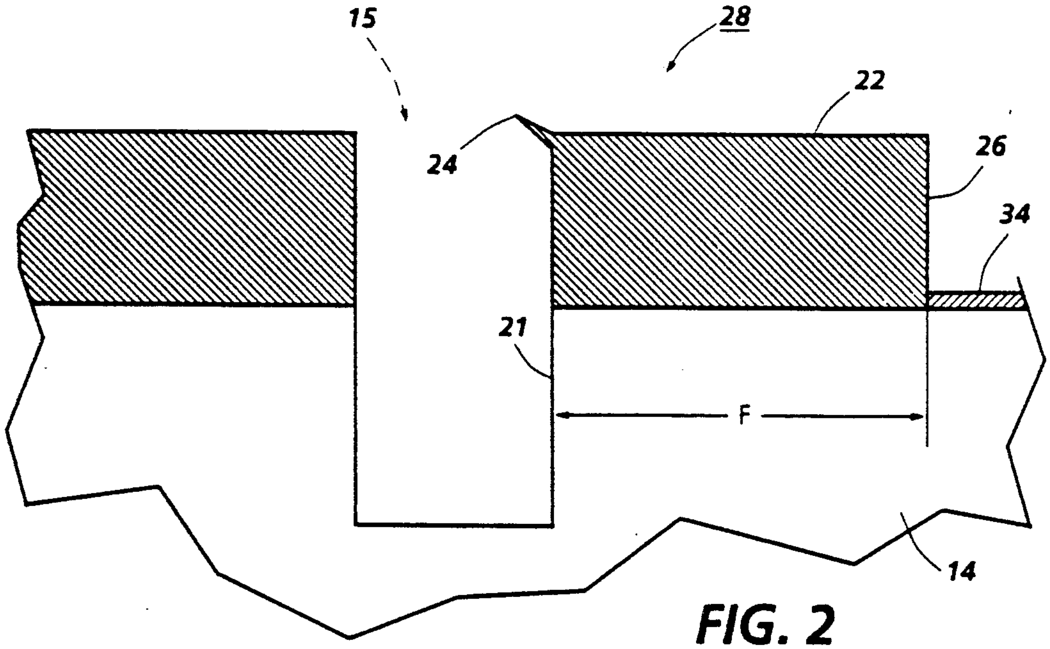
FIG. 2 (Prior Art)
FIG. 2 is an enlarged cross-sectional view of the portion of the printhead of FIG. 1 showing the effect of dicing on the thick film layer between the channel and heating element wafers.

Although U.S. Pat. No. 4,878,992 offered a much improved and cost effective fabricating process with the special resinoid dicing blade, thick film burrs 24 tended to be formed which reduced the yield of printheads as shown in FIG. 2. FIG. 2 is an enlarged cross-sectional view of the thick film layer at the nozzle face 21 prodced by the prior art dicing technique of FIG. 1, showing a concurrent dicing cut through the channel wafer, thick film layer, and partially through the heater wafer, after the two wafers were aligned and bonded together.

Referring to prior art FIG. 1, the rear channel length 25 of the thermal ink jet die (i.e., the distance "R" from the heating element 34 to the reservoir 18) is determined by the placement of the rear closed ends 27 of the channels 16 during the aligning and bonding step. However, the front channel length "F" from the heating element to the nozzle 20 (channel groove open end) is determined by the placement of the dicing blade during nozzle dicing of the front of the channels which produces the nozzle face 21. This process enables one to set the front channel length to any desired value without changing the photo mask. The main disadvantage of this procedure is that the thick film layer of, for example, polyimide can not be cut cleanly in a reliable way. When the polyimide is not cut cleanly, a ragged burr of about 2 μm in length is left in the polyimide that forms the base side of the nozzle, which in this case is triangular in shape. The polyimide burr 24, shown in FIG. 2, causes misdirection of a thermal ink jet droplet which results in an image defect. Also, the polyimide causes the dicing blade to wear 50 times faster than silicon, causing blade life to be dependent on the polyimide alone. The polyimide also causes the dicing blade to wear unevenly thus requiring frequent dressing of the blade. Frequent dressing will shorten blade life by many wafers.

Figure 3:
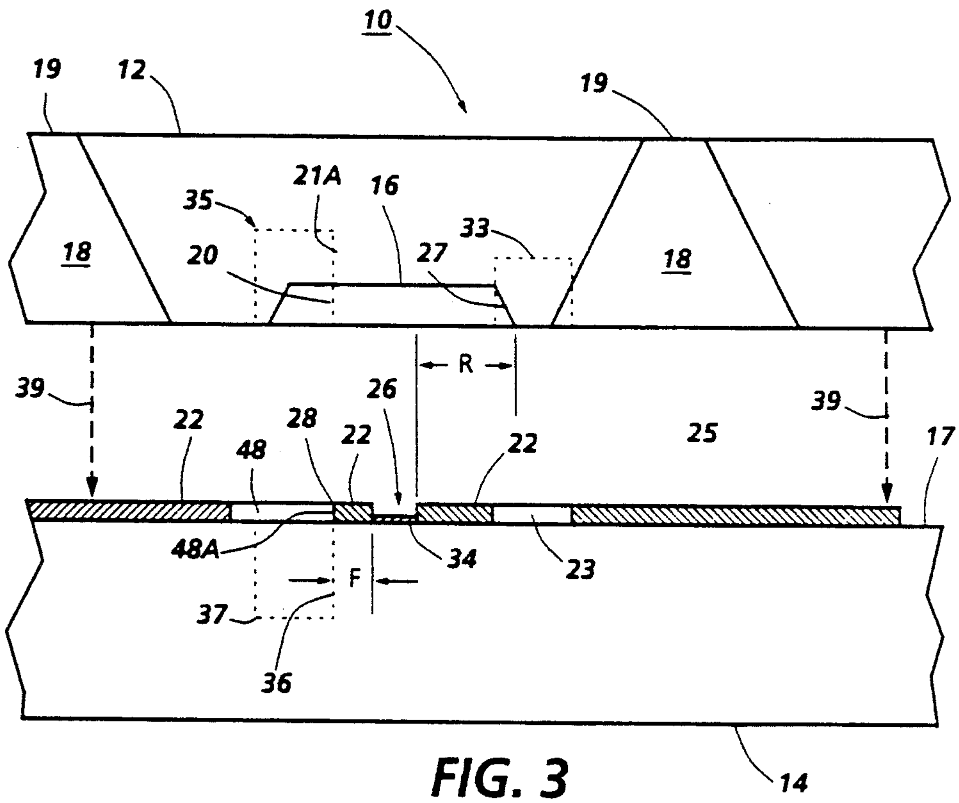
FIG. 3 is a cross-sectional view of the present invention, showing a fabrication step prior to alignment and bonding of the channel and heating element wafers.

Thermal ink jet printheads suitable for commercialization have fixed values of front and rear channels portions or lengths. In FIG. 3, the front channel length 28, having the distance F, of the present invention has its thick film layer 22 photodelineated, so that the nozzle face cutting by a resinoid dicing blade (not shown) does not involve dicing the thick film layer. This provides two chief benefits, viz., there are no burrs generated and the dicing blade life is longer.

Figure 4:
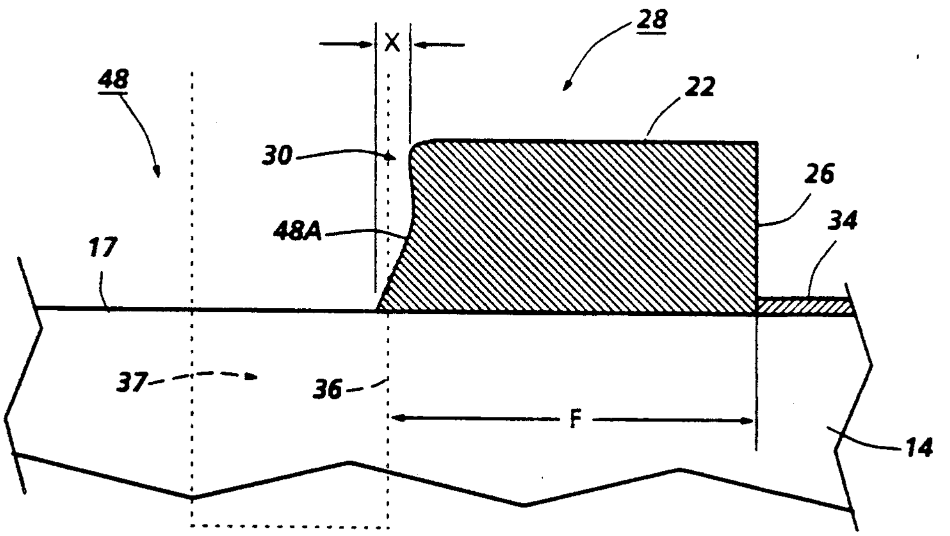
FIG. 4 is an enlarged cross-sectional view of a portion of the photodelineated thick film layer between the channel and heating elements wafers according to the present invention.

Referring to FIGS. 3 and 4, cross-sectional views of the present invention, portions of an electrically insulative planar substrate, such as, for example, a silicon wafer 14 and anisotropically etched (100) silicon wafer 12 are shown prior to being aligned and bonded together to form a plurality of unseparated printheads 10. Arrows 39 indicate how the wafers 12, 14 are subsequently mated. The silicon wafer 14, also referred to as a "heater wafer", has an electrically insulating layer (not shown) deposited on both sides thereof, such as, for example, silicon dioxide or silicon nitride. A plurality of linear arrays of resistors or heating elements 34 and associated addressing electrodes (not shown) are formed on the insulating layer on surface 17 of the heater wafer as disclosed in U.S. Pat. No. Re 32,572 discussed above and incorporated herein by reference. Each heating element is selectively addressable through the electrodes with electrical pulses representative of digitized data signals. A photopatternable film layer 22 is laminated or deposited on heater wafer surface 17 over the heating elements and addressing electrodes and patterned for etch removal of the thick film layer at predetermined locations. The thick film layer may be, for example, Vacrel® or Riston®, but is preferably polyimide. The thickness of the thick film layer is 10 to 100 μm and preferably 25 μm. As disclosed in U.S. Pat. No. 4,638,337 and U.S. Pat. No. 4,774,530 and incorporated herein by reference, the heating elements and electrode terminals are cleared of the thick film layer. Each heating element is effectively placed in a pit 26 in the thick film layer. Optionally, an elongated recess is formed which subsequently functions as an ink passageway 23 between the manifold or reservoir recess 18 and the channel grooves 16. In addition, the thick film layer is concurrently patterned to enable etch removal of slots 48 having at least one sidewall 48A parallel to and spaced a predetermined distance "F" from the pits 26. The distance F is between 90–130 μm and preferably about 120 μm. Portions of the slot sidewall becomes the base portion of the nozzles 20 as will become apparent after alignment and mating with the etched silicon wafer.

The silicon wafer 12, also referred to as the "channel wafer", is a (100) silicon wafer that is patterned and anisotropically etched on one surface to form a plurality of sets of parallel channel grooves 16 and a through etched recess 18 for use as a manifold or reservoir for each set of channel grooves as disclosed in U.S. Pat. Nos. 4,638,337 and 4,774,530. The channel grooves are about 250 to 450 μm long with closed ends and have a triangular cross-section with the bottom of the groove being the apex; the depth of the groove apex is about 40 μm. Ends 27 of each set of channel grooves are adjacent, but spaced from their associated manifold recess 18. The open bottom of the manifold recess serves as an ink inlet 19 to the manifold recess from an ink supply (not shown). The cross-sectional view in FIG. 3 shows only a portion of the wafers which, when mated, will contain only one unsevered printhead 10 for ease in understanding the invention, but if a cross-sectional view were shown of the entire wafers, several unsevered printheads would be shown.

Figure 8:
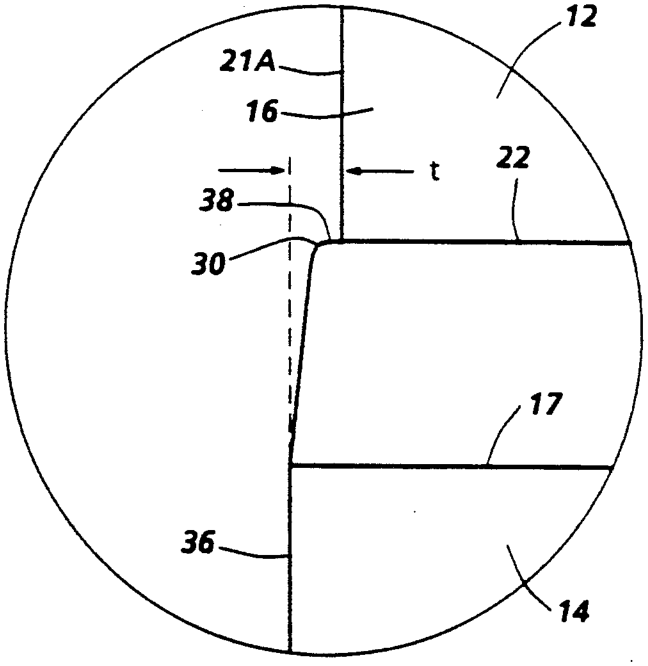
FIG. 8 is an enlarged cross-sectional view of the area identified in FIG. 7 as circle "A".

In FIG. 3, the front or downstream end of the channels, opposite closed ends 27 which are adjacent the manifold or reservoir, are diced to form a kerf or trench 35 having a depth of about half the thickness of the channel wafer before the channel wafer is aligned and bonded to the heater wafer. One wall of kerf 35 contains the open ends of the channel grooves which will serve as the printhead nozzles 20, and the rest of this wall serves as the nozzle face 21A. Optionally, the rear or opposite end of the channel, (i.e., the one adjacent the reservoir) could also be diced open by dicing a kerf 33 shown in dash line, instead of patterning the thick film layer to produce passageway 23. If this option is used, then, after the printheads are severed into individual units, the ends of this diced kerf 33 must be plugged by, for example, an adhesive to prevent ink leakage out the open ends of kerf 33. The dicing of kerf 35 coupled with either kerf 33 or thick film layer passage 23 fixes the overall channel length. In another embodiment, the heater wafer is diced before mating with the channel wafer to form kerf or trench 37 parallel and contiguous to the slot sidewall 48A having a depth of about half the thickness of the heater wafer. The trench 37 is shown in dashed line and is parallel to the slot sidewall and heating element arrays. One wall 36 of the trench 37 is designed to be coplanar with the nozzle face 21A after mating of the channel and heater wafers. However, a step 38 having a distance "t" of 1 to 30 micrometer could be optionally designed to occur between the channel nozzle face 21A and the front face 36 of the heater plate or wafer, as shown in FIG. 8; when this step 38 includes the slope "X" of the photodelineated end of the thick film layer 22, as discussed later in FIG. 4 the distance is about 3 to 36 μm.

Figure 5:
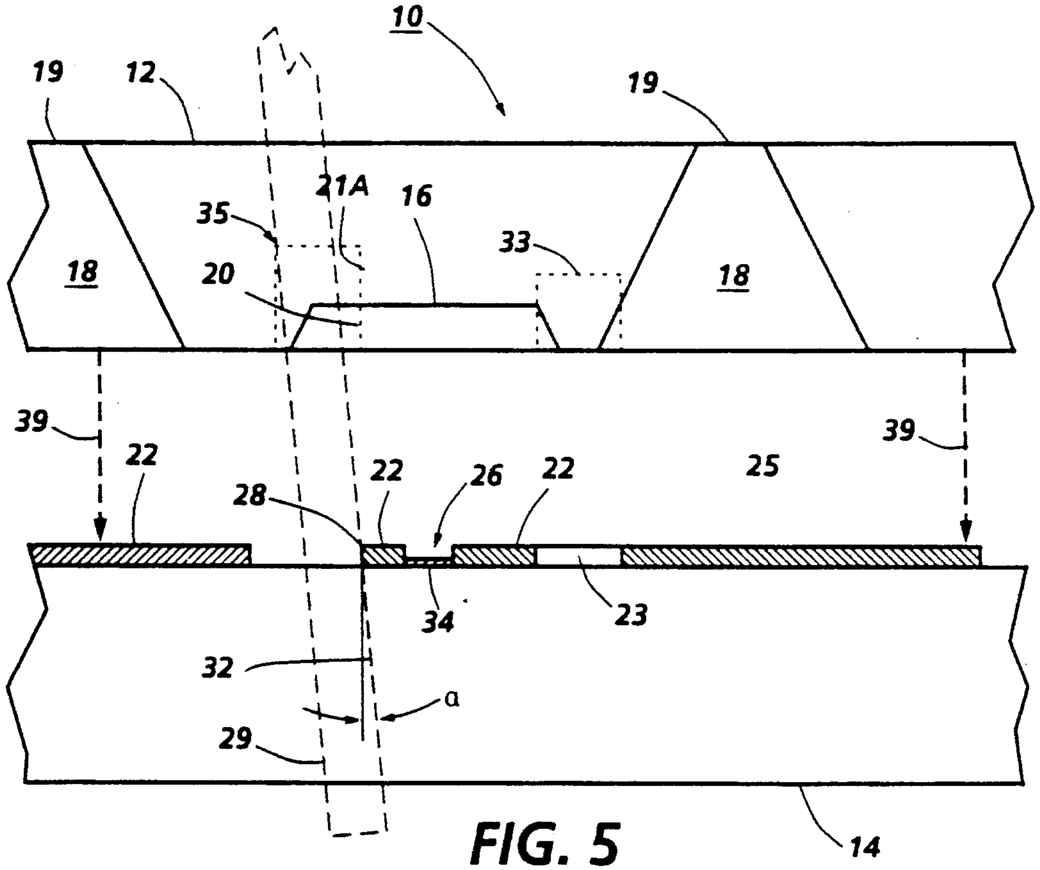
FIG. 5 is an alternative embodiment of the fabrication procedure for FIG. 3, wherein the dicing blade which severs the mated wafers into separate printheads is at an angle.

Referring to FIG. 4, the photo-delineated slot 48 defines the front channel portion 28 as the portion of thick film layer between the sidewall 48A of the slot and the pits 26 having the distance F. The slot sidewall has a rounded corner edge 30 with a 2 to 6 μm generally sloping surface from the top edge to the heater wafer surface 17 as indicated by dimension "X". Thus, when the optional kerf 37 (shown in dashed line) is made, producing the heater wafer front face 36, the polyimide forming the base of the triangular channel, produced when the wafers are mated, is very smooth, uniform, and without burrs. This is because the resinoid dicing blade which cuts kerf 37 makes minimal contact with the polyimide thick film layer, and the blade wear is due entirely to silicon, so that blade life is greatly increased. In the embodiment without the trench or kerf 37, see FIG. 10, the mated wafers are severed into a plurality of printheads by a metal dicing blade 29 (shown in dashed line), forming a step 31A at the base of the slot sidewall 48A because dicing blade 29 is spaced from the nozzle face 21A of the above channel wafer by a width of 20 to 30 μm as it cuts the heater wafer. FIG. 5, similar to FIG. 3 except kerf 37 is omitted, shows this step 31A substantially eliminated by slanting dicing blade 29. If this step 31A tends to gather ink and droplet directionality is affected, it may be necessary to lower it to the location of step 31 in FIG. 6 by kerf 37. Slanting the dicing blade 29 enables cutting closer to the intersection of the thick film layer and surface 17 of the heater wafer, because the angled coarse cutting dicing blade 29 will not contact the smooth nozzle face 21A produced by a fine cutting resinoid blade (not shown) in cutting kerf 35.

Figure 6:
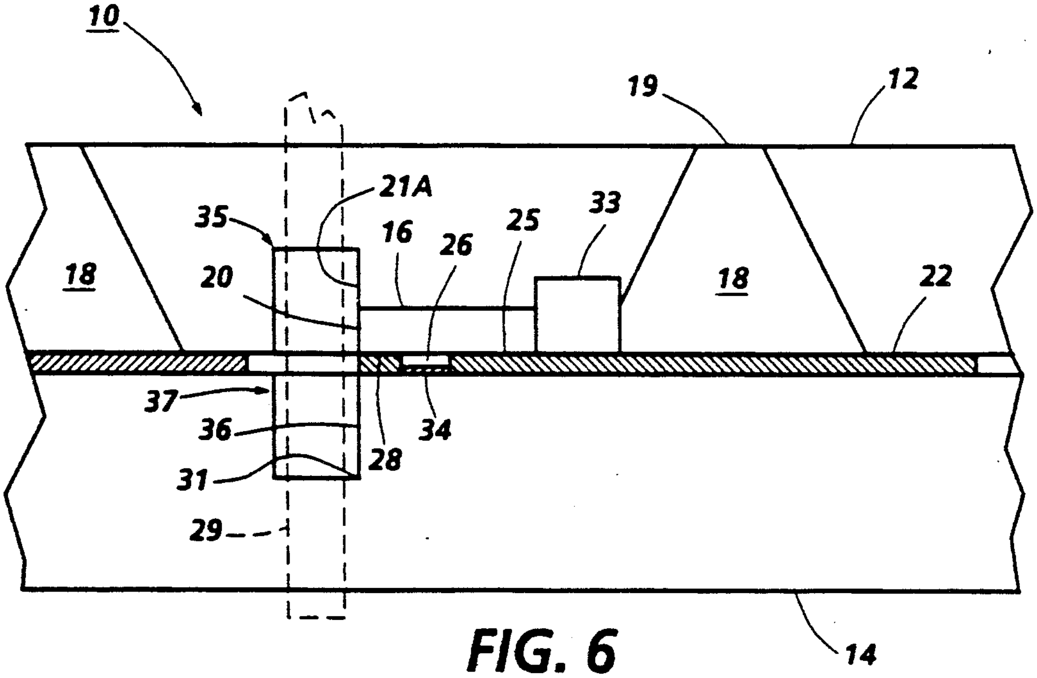
FIG. 6 is the cross-sectional view similar to FIG. 3 but showing the channel and heating elements wafers of the present aligned, bonded, and ready for separation into individual printheads.

A small step or shelf 31 is produced by the dicing cut that forms kerf 37 in the heater wafer 14 as shown in FIG. 6, the preferred embodiment of the present invention. Because the step 31 is well below the nozzle 20, ink built up that might affect droplet directionality is not a problem. However, this step 31 may be eliminated if the second dicing cut that separates the bonded wafers into individual printheads is made at a slight angle $\alpha$ of 1 to 10 degrees similar to that in FIG. 5, but with the wafers mated and lower as shown in FIG. 10A. Thus, the front surface portion 32 of the heater wafers produced by the slanted dicing blades will also have an inward slope of $\alpha$ degrees relative to the nozzle face and/or heater wafer front face 36.

When the optional dicing cut that produces kerf 33 for opening the channels 16 to the reservoir 18 is used to open the channels to the reservoir, then, of course, the thick film layer passage 23 is not necessary, as shown in FIG. 6. A dicing cut that produces kerf 35 determines the channel length and the quality of the nozzle face 21A, as well as concurrently opening the front ends of the channels and forming the nozzles 20. The pre-mating dicing cut made in the heater wafer that forms kerf 37 is optional but provides the preferred embodiment. This kerf is made by cutting up to the edge of the photo-delineated thick film layer that defines the front channel portion 28. The optional kerf 33 has a depth of slightly more than the etched depth of the channels; for example, about 80 to 100 μm The kerfs 35, 37 have a depth of about half the wafer thickness or about 10 mils.

Figure 7:
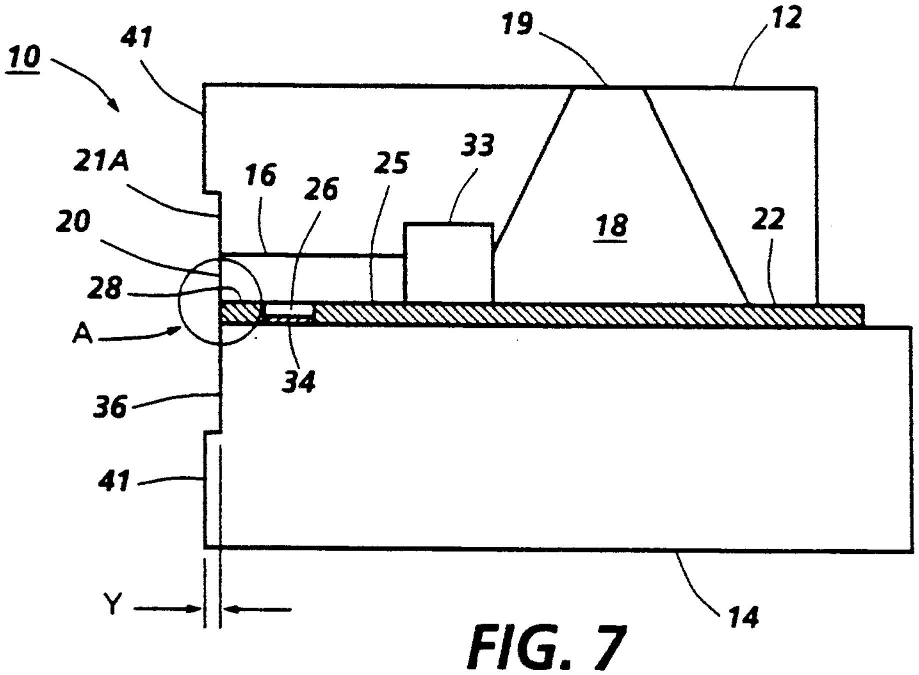
FIG. 7 is a cross-sectional view of the printhead of the present invention after separation into individual printheads.
Figure 9:
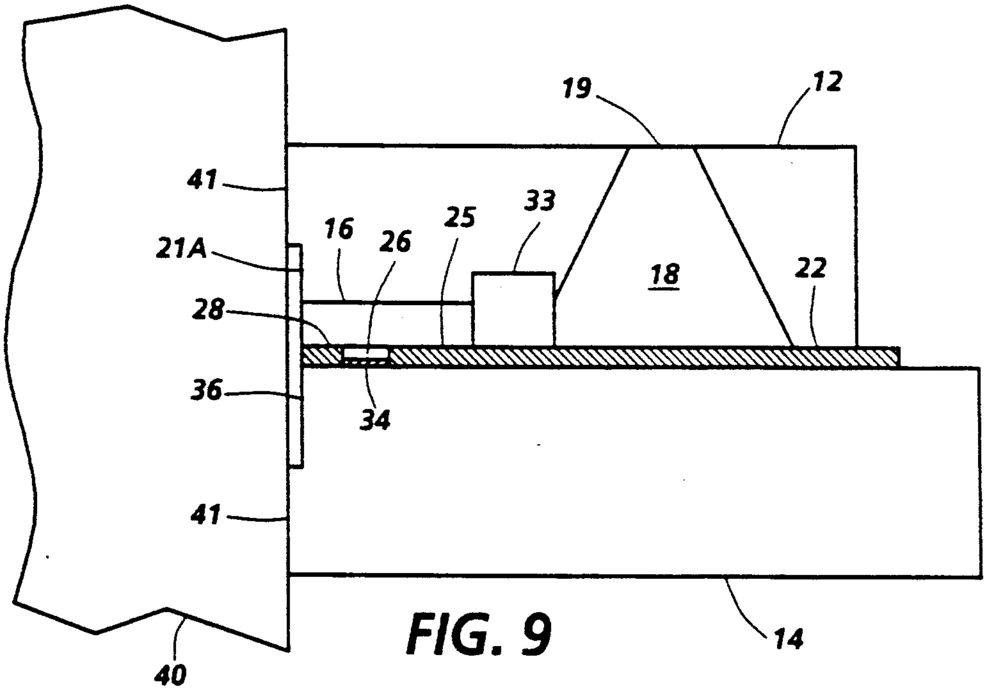
FIG. 9 shows the nozzle face of the printhead of FIG. 7 being cleaned by a blade cleaner.

With the dicing cuts completed, the channel and heater wafers are aligned and bonded with an infrared aligner (not shown). With the preferred embodiment of FIG. 6, the kerfs 35 and 37 are aligned by an infrared aligner (not shown). Once the wafer pair is bonded, the final section cut for separating the printheads is colinearly made as indicated by the typical metal dicing blade 29 shown in dashed line in FIG. 6, wherein kerfs 33, 35, and 37 are shown. A completed printhead 10, fabricated according to the fabricating technique of FIG. 6, is shown in FIG. 7 in a schematic cross-sectional view. Note that the optional kerf 33 is used to provide the communication between the reservoir and channels instead of the patterned passageway 23 in the thick film layer 22. The front edge of the printhead comprises the nozzle face 21A and heater wafer front face 36 which are recessed from the rest of the printhead front edge 41 by a dimension "Y" of between 0 and 50 μm. The downstream edge of the photo-delineated front channel portion 28 of the polyimide thick film layer 22 that is the base part of the triangular nozzles 20 is encircled by circle "A" and shown enlarged as FIG. 8 with the optional step 38 shown, as mentioned above by predetermined misalignment "t" of 1 to 30 μm which may be desired to correct any droplet misdirectionality caused by the sloping slot sidewall surface. FIG. 9 is similar to FIG. 7, but has a blade cleaner 40 added to show that the nozzle face is protected from the blade cleaner, when the printhead front edge 41 is being cleaned.

Figure 10:
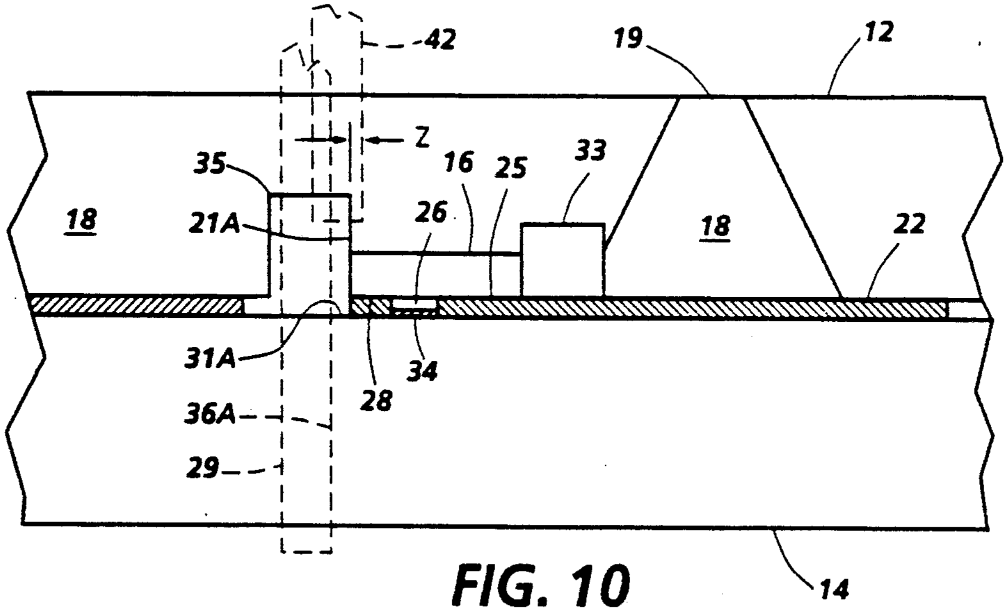
FIG. 10 is a cross-sectional view an alternate fabricating embodiment of the invention.
Figure 10A:
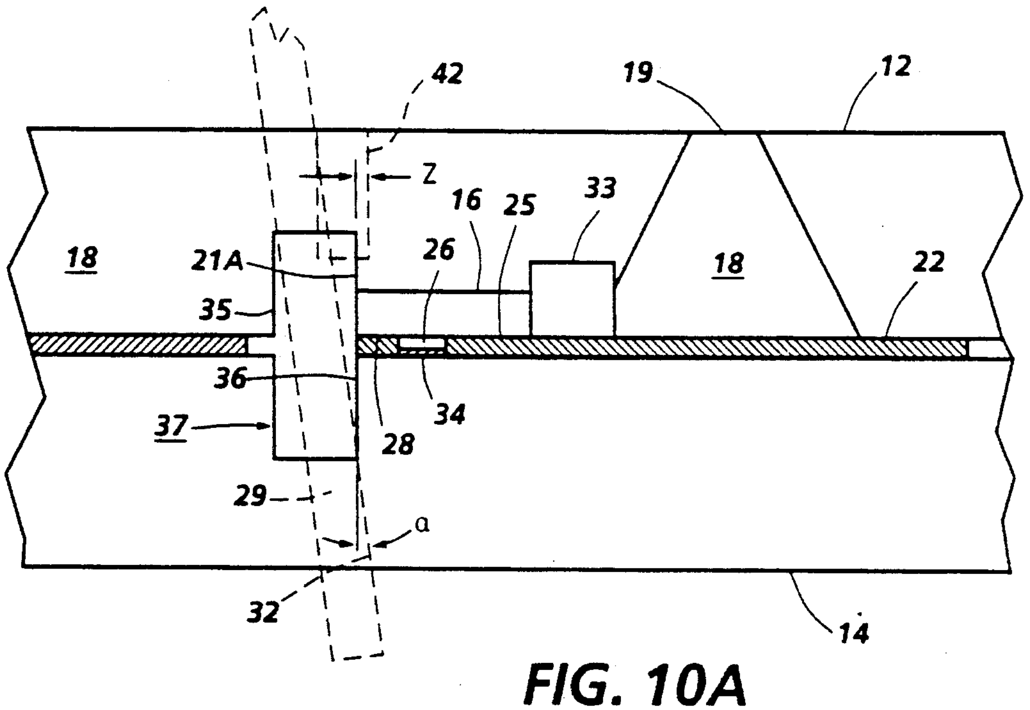
FIG. 10A is another alternative embodiment for the fabrication step shown in FIGS. 6 and 7, wherein the dicing blade severing the mated wafers into separate printheads is at an angle.
Figure 11:
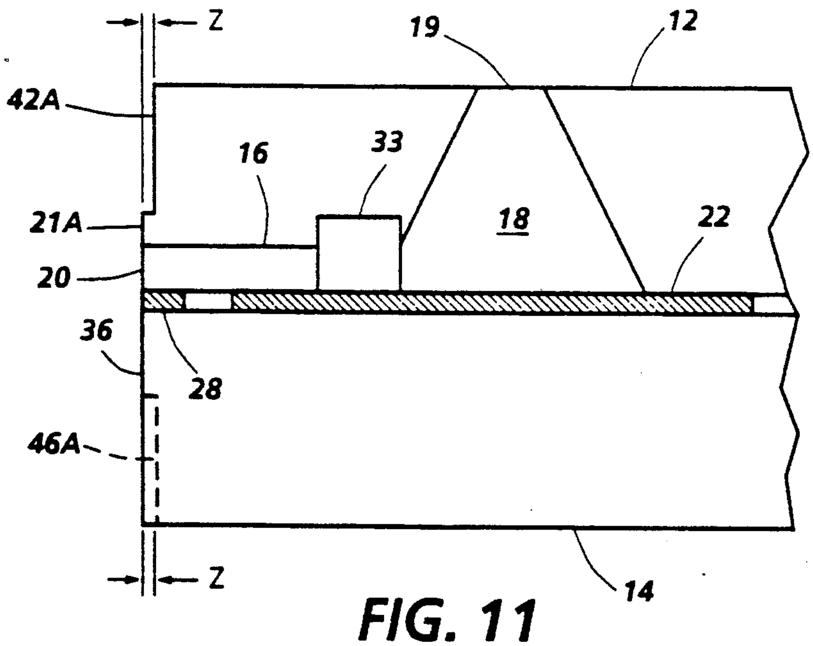
FIG. 11 is a cross-sectional view of the printhead according to the fabricating method shown in FIG. 10.
Figure 12:
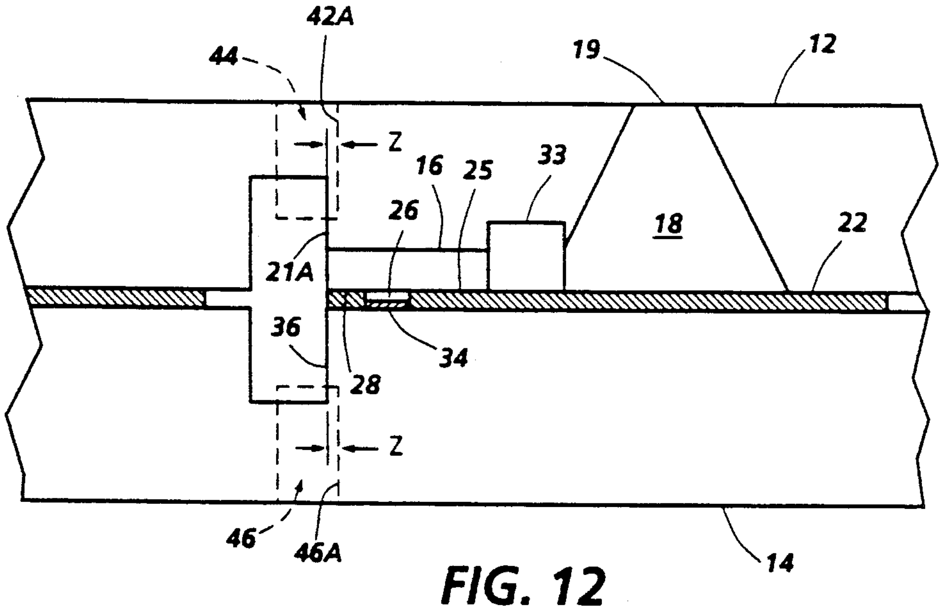
FIG. 12 is a cross-sectional view of another fabricating embodiment of the invention.

Another embodiment of the invention is shown in FIGS. 10 and 11. In this embodiment the prebonding cut producing the kerf 37 in the heater wafer is optionally omitted. FIG. 10 shows the channel wafer and heater wafer after alignment and bonding in a view similar to FIG. 6. The only difference is that the heater wafer kerf 37 is missing. The dicing blade 29 for separating the printheads is shown in dashed line. An additional dicing operation may be used prior to removal of the severed printheads from the dicing frame (not shown) to produce kerf 42, shown in dashed line in FIG. 10, so that the nozzle face 21A is made to protrude from the printhead front edge 42A for contact cleaning of the nozzle face 21A as shown in FIG. 11. After the printheads are severed by the dicing blade 29, a rough heater wafer front face 36A is formed with step 31A near the nozzles 20. If step 31A tends to collect ink and becomes undesirable, the dicing blade 29 could be slanted as shown in FIG. 5 to remove it. FIG. 12 shows another fabricating procedure to produce printheads having a protruding or raised nozzle face 21A and heater wafer front face 36.

FIG. 12 is similar to FIG. 6, except that two partial dicing cuts are made to sever the bonded pairs of wafers into separate printheads. One such cut produces kerf 44 in the channel wafer 12 and is shown in dashed line. One wall of this kerf 44 serves as the recessed printhead front edge 42A, while a second similar dicing cut produces kerf 46 in the heater wafer 14. Kerf 46 is shown in dashed line, and one wall 46A thereof serves as the rest of the recessed printhead front edge. To perform the final dicing cut in the heater wafer, the bonded wafer pair must be removed from one dicing frame and placed in another one. The nozzle face 21A and heater wafer front face 36 protrude from the printhead front edges 42A and 46A by the distance "Z" of 0 to 50 $\mu$m, as shown in FIGS. 11 and 12, where the printhead front edge 46A made by kerf 46 is shown in dashed line. When the nozzle face and heater wafer front face protrude, they may be positioned closer to the recording medium. However, contact cleaning must be gentler.

Front face defects typically found using the prior art post bonding dicing procedure include breakout, chipping around the nozzles glue pull outs, polyimide burrs and silicon chunks lodged in the channel. Breakout is when large pieces of silicon break away from the base of the nozzle during dicing, causing a fatal directionality defect. Breakout always occurs where the bottom of the wafer being cut is poorly supported as in the post dicing procedure. The prebonding dicing procedure makes the same cut but with the important structures on top of the wafer where breakout will not occur. Breakout is the defect that prevents high dicing feed rates. For prebonding dicing, the feed rate is only limited by dicing blade capability. A 16 fold increase in feed rate has been demonstrated. Chipping defects are probably a result of small silicon chunks that have come loose due to breakout and then are accelerated by the dicing blade as they move between the dicing blade and the die front face. The fast moving chunks then impinge on the nozzle edges. The chipping defect has not been seen on channels cut using the prebonding dicing procedure even at very high feed rates. Glue pullouts occur when too much adhesive is used to bond the wafer pair. Too much adhesive causes the glue fillets at the base of the channel to be large. Because the epoxy used to bond the wafers does not cut cleanly, the glue fillet is pulled by the dicing blade until it finally breaks, leaving a protrusion at the base of the die. The protrusion will collect ink and cause misdirection of a jetted drop of ink. The polyimide burr defect discussed earlier is caused by using a dicing blade to cut polyimide. Although it is possible to cut polyimide cleanly, it is difficult to achieve consistently. Typically, a 2-3 micron burr remains after a dicing cut at the base of the channel. The burr has some effect on ink jet directionality. By photodelineating the polyimide to the correct front channel length, only the tail of the sloped polyimide edge is cut and it has been demonstrated that no burr results. Silicon chunks are lodged in the channel when chunks of silicon pass between the blade and the front face and then get impacted into the die channel. The pre-dicing or prebonding dicing procedure of the present invention substantially precludes this from occuring by maintaining a large distance between the front face and the sectioning blade (>25 microns). A wafer diced using the prebonding dicing method shown in FIG. 3 have substantially none of the defects listed above.

In summary, this invention relates to an improved thermal ink jet printhead and improved method of making it. The method comprises forming a plurality of arrays of heating elements and addressing electrodes therefor on one surface of a silicon wafer or substrate and depositing and photopatterning a thick film layer of polyimide or other photo-patternable material, so that the heating elements and electrode terminals are exposed. In one embodiment, a recess is patterned in thick film layer for each array of heating elements for subsequent use as an ink passageway, as is well known in the art. An elongated slot is also formed in the thick film layer a predetermined distance downstream from the heating elements and parallel thereto. This predetermined distance defines the distance from the nozzles to the heating elements and provides the means for photodelineation of the thick film layer so that after bonding an anisotropically etched channel wafer thereto, the bonded pair of wafers may be diced into a plurality of individual printheads without the need to dice the thick film layer. This means that burrs of thick film material will not be formed in the nozzle and dicing blade life is greatly increased. The channel wafer is patterned and anisotropicaly etched to produce a plurality of sets of elongated channel grooves, closed at both ends, and a through recess for each set of channel grooves which will subsequently serve as a reservoir, whose open bottom will serve as an ink inlet.

In one embodiment, the etched channel wafer is diced about half through the channel wafer before mating with the heater wafer in predetermined locations. This dicing is perpendicular to the ends of the channel grooves and forms the nozzle faces and the part of the nozzles that are in the channel wafer. The wafers are aligned and bonded so that each channel has a heating element and the photo-delineated thick film layer completes the nozzle. In the preferred embodiment a similar prebonding dicing cut is made in the heater wafer, which will be aligned with the one in the channel wafer. The printheads are separated by another dicing cut through both wafers which is colinear to the prebonding partial cuts or trenches, so that the nozzle faces are not touched. Other embodiments cause the nozzle faces of the printheads to protrude instead of being recessed, depending upon the type of contact cleaning desired or how close to the recording medium the nozzles are required.

Many modifications and variations are apparent from the foregoing description of the invention, and all such modifications and variations are intended to be within the scope of the present invention.

I claim:

1. A method of fabricating a thermal ink jet printhead having nozzles for ejecting droplets therefrom comprising the steps of:

(a) forming a plurality of sets of equally spaced linear arrays of heating elements and addressing electrodes on a surface of an electrically insulative planar substrate, the heating elements being individually addressable with electrical pulses through said electrodes;

(b) depositing a thick film layer of photopatternable polymeric material over the heating elements and electrodes;

(c) patterning the thick film layer to form a plurality of pits therein, each of which exposes one of the heating elements, and to form an associated slot having at least one sidewall for each set of pits, the distance between each set of pits and the associated slot defining the distance to the heating elements from the nozzles, so that the slot sidewall forms a part of the printhead nozzles;

(d) etching a plurality of sets of equally spaced, parallel channel grooves having closed ends and an associated through recess for each set of channel grooves in the surface of a silicon wafer, the through recesses being located adjacent one end of said grooves;

(e) providing means for communication between each set of grooves and their associated through recess;

(f) dicing a first trench in the silicon wafer having a predetermined depth perpendicular to and across each of the groove ends opposite the ones adjacent the through recesses to form a nozzle face containing the groove open ends that will subsequently become part of the printheads nozzles;

(g) aligning and bonding the etched wafer with the planar substrate so that each channel groove contains a heating element therein a determined distance from the open end thereof; and (h) separating the bonded wafer and substrate into individual printheads by a plurality of dicing cuts, one of which includes colinear dicing of the wafer and substrate along and through the wafer trenches, but spaced from the nozzle face.

2. The fabricating method of claim 1, wherein said means for providing communication between each set of grooves and their associated through recess is accomplished by dicing a second trench in the silicon wafer of predetermined depth parallel to the first trench; the second trench opening the channel groove closed ends adjacent the through recess and removing the silicon wafer material therebetween.

3. The fabricating method of claim 1, wherein said means for providing communication between each of the channel grooves in their respective sets with their associated through recess is accomplished during step (c) by additionally patterning an elongated recess in the thick film layer which will provide an ink flow passageway between the set of grooves and its associated through recess after the wafer and planar substrate are mated.

4. The fabricating method of claim 2, wherein said planar substrate is a silicon wafer with an electrically insulative layer on the surfaces thereof;

wherein the method further comprises the steps of:

(i) prior to step (g), dicing third trenches of predetermined depth in said silicon wafer, the third trenches each being parallel to the heating element arrays and said slots in the thick film layer, the third trenches diced in the planar substrate being adjacent the sidewall forming part of the nozzles but located so that said dicing cut has substantially no contact with the thick film layer; and wherein said aligning at step (g) is accomplished using an infrared aligner to align the diced first trench in the etched wafer with the diced third trench in the silicon wafer containing the thick film layer, so that the walls of the first and third trenches are coplanar.

5. The fabricating method of claim 3, wherein said planar substrate is a silicon wafer with an electrically insulative layer on the surfaces thereof;

wherein the method further comprises the steps of:

(i) prior to step (g), dicing third trenches of predetermined depth in said silicon wafer, the third trenches each being parallel to the heating element arrays and said slots in the thick film layer, the third trenches diced in the planar substrate being adjacent the sidewall forming part of the nozzles but located so that said dicing cut has substantially no contact with the thick film layer; and wherein said aligning at step (g) is accomplished using an infrared aligner to align the diced first trench in the etched wafer with the diced third trench in the silicon wafer containing the thick film layer, so that the walls of the first and third trenches are coplanar.

6. The fabricating method of claim 2, wherein the dicing cuts separating the bonded wafers into individual printheads at step (h) are made along a plane which intersects, at a predetermined angle, a plane containing the nozzle face at the interface between the slot sidewall of the thick film layer and the silicon wafer surface containing the thick film layer.

7. The fabricating method of claim 3, wherein the dicing cuts separating the bonded wafers into individual printheads at step (h) are made along a plane which intersects at a predetermined angle a plane containing the nozzle face at the interface between the slot sidewall of the thick film layer and the silicon wafer surface containing the thick film layer.

8. The fabricating method of claim 3, wherein during step (g) the wafers are misaligned to form a step of thick film layer that extends perpendicularly from the nozzle face a predetermined distance.

9. The fabricating method of claim 4, wherein the dicing cuts separating the bonded wafers into individual printheads are made along a plane which intersects at a predetermined angle a plane containing the nozzle face and the coplanar wall of the third trench, the planes intersecting at the bottom of the third trench.

10. The fabricating method of claim 4, wherein the dicing cuts separating the bonded wafers into individual printheads at step (h) are made by two separate trenches from opposite sides of the bonded wafers, these trenches intersect the first and third trenches.

11. The fabricating method of claim 10, wherein the separate trenches from opposite sides of the bonded wafers are offset from the first and third trenches by a predetermined amount, so that the nozzle face with the nozzles protrude from the rest of printhead surface containing the nozzle face.

12. An improved method of fabricating a plurality of ink jet printheads from at least two substrates having confronting surfaces aligned and bonded together with a patterned thick film polymeric layer sandwiched therebetween, wherein the confronting surface of one substrate contains a plurality of sets of equally spaced, linear arrays of heating elements and addressing electrodes having terminals for enabling the individual addressing of each heating element with current pulses, and wherein the confronting surface of the other substrate contains a plurality of sets of equally spaced, parallel grooves and a through recess for each set of grooves, one end of each set of grooves communicate with one of the recesses which is connected to an ink supply means, prior bonding to the other substrate, the thick film layer is laminated on the surface containing the heating elements and electrodes and patterned to expose the heating elements, and the other ends of the grooves subsequently forming part of the printhead nozzles which eject droplets, wherein the improvement comprises the steps of:

(a) concurrently patterning the thick film layer to not only expose the heating elements thereby placing them each in a pit, but also to form elongated slots through the thick film layer the slots having sidewalls parallel to the heating elements arrays and a predetermined distance therefrom the slot sidewall nearer to the heating elements subsequently becoming a portion of the nozzles, thereby defining the distance of the nozzles from the heating elements;

(b) after the etch forming of the grooves and associated through recesses and prior to aligning and bonding the two substrates, dicing a first trench in the substrate surface having the grooves and through recesses, the trench having a determined depth and being cut perpendicular to and through the ends of each set of grooves opposite the ones adjacent the through recess to form the printhead nozzle faces prior to bonding of the two substrates together; and (c) separating the plurality of printheads by a dicing process which includes cutting through both of the bonded substrates parallel to and colinear with the first trenches, so that this dicing cut has substantially no contact with the thick film layer.

13. The improved method of claim 12, wherein the improvement further comprises the steps of:

(d) dicing second trenches in the substrate containing the heating elements adjacent and parallel to the slot sidewalls which will subsequently become a portion of the nozzles, so that the separation into a plurality of printheads during step (c) will produce printheads with a recessed nozzle face.

14. An improved ink jet printhead of the type having a linear array of droplet ejecting nozzles and a silicon upper substrate in which one surface thereof is anisotropically etched to form both a set of parallel grooves for subsequent use as ink channels and an anisotropically etched recess for subsequent use as a manifold, and further having a lower substrate in which one surface thereof has an array of heating elements and addressing electrodes formed thereon, the upper and lower substrates being aligned, mated, and bonded together to form the printhead with a thick film insulative layer sandwiched therebetween, the thick film insulative layer having been deposited on the surface of the lower substrate and over the heating elements and addressing electrodes and patterned to form recesses therethrough to expose the heating elements and terminal ends of the addressing electrodes prior to said mating and bonding of the substrates, wherein the improvement comprises:

said etched channel grooves in the upper substrate each being opened at the ends opposite the ones adjacent the manifold recess to produce portions of said nozzles, before mating with the lower substrate by a dicing cut that perpendicularly intersects the grooves and forms a trench of predetermined depth having parallel sidewalls so that only one of the trench sidewalls intersect the grooves to define a subsequent portion of a nozzle face for the printheads containing the groove open ends which form a portion of the printhead nozzles, the other ends of the grooves being placed into communication with the manifold recess;

an elongated slot being formed in the thick film layer on the lower substrate currently with the heating elements and electrode terminal exposing recesses and at a location which is parallel to the heating elements array and spaced therefrom a predetermined distance, the slot having parallel sidewalls with the sidewall nearer the heating elements subsequently becoming a portion of the printhead nozzles;

said upper and lower substrates being aligned and mated so that the trench in the upper substrate is aligned with the slot in the thick film layer on the lower substrate forming said ink channels and manifold with the open ends of the grooves forming said nozzles together with the thick film sidewall nearer the heating elements; and after mating and bonding of the upper and lower substrates, a stepped nozzle face is formed by dicing along a plane parallel to and through upper substrate trench and thick film slot on the lower substrates so that said nozzle face portion containing the nozzles is recessed from the remainder of the nozzle face produced by dicing after mating and bonding.

15. The printhead of claim 14, wherein lower substrate is diced to produce a trench therein having sidewalls similar to the trench in the upper substrate and located adjacent the thick film sidewall nearer the heating elements, said trenches being aligned so that the trench sidewall in the lower substrate adjacent the thick film sidewall and the trench sidewall in the upper substrate containing the groove open ends are coplanar and form the recessed portion of the stepped nozzle face.

16. The printhead of claim 15, wherein the communication between the manifold recess and the channel grooves being accomplished by a dicing cut of predetermined depth to remove the upper substrate material therebetween.

17. The printhead of claim 15, wherein the communication between the manifold recess and the channel grooves being accomplished by patterning a trough in the thick film layer located to produce a flow passageway therebetween.

18. The printhead of claim 15, wherein the stepped nozzle face is modified so that the portion containing the nozzles is raised while the remainder of the nozzle face is recess by dicing the imaged and bonded substrates separately with dicing blades located a predetermined distance toward said heating element and having a predetermined depth of cut.

* * * * *